(12) United States Patent
Yin et al.

(10) Patent No.: US 6,903,616 B2
(45) Date of Patent: Jun. 7, 2005

(54) STARTUP CIRCUIT AND METHOD FOR STARTING AN OSCILLATOR AFTER POWER-OFF

(75) Inventors: Rong Yin, Coppell, TX (US); Mehdi Zamanian, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/603,238

(22) Filed: Jun. 24, 2003

(65) Prior Publication Data

US 2004/0263264 A1 Dec. 30, 2004

(51) Int. Cl.[7] .................................................. H03B 1/00
(52) U.S. Cl. .......................... 331/57; 331/158; 713/300
(58) Field of Search ................................ 331/158, 160, 331/57, 176, 116 R, 46

(56) References Cited

U.S. PATENT DOCUMENTS

| | | | | | |
|---|---|---|---|---|---|
| 4,328,571 | A | * | 5/1982 | Noble | 368/87 |
| 6,085,327 | A | * | 7/2000 | Seng et al. | 713/300 |
| 6,219,797 | B1 | * | 4/2001 | Liu et al. | 713/500 |
| 6,670,860 | B2 | * | 12/2003 | Kobayashi et al. | 331/158 |

* cited by examiner

Primary Examiner—Robert Pascal
Assistant Examiner—Joseph Chang
(74) Attorney, Agent, or Firm—Lisa K. Jorgenson; Andre M. Szuwalski

(57) ABSTRACT

A method and circuit are disclosed for enabling an oscillator circuit to oscillate a predetermined period of time following completion of a power-up operation. The circuit may include a counter having a control for receiving a control signal from a system power-on-reset circuit, and a clock input. A ring oscillator has an output coupled to the clock input of the counter.

29 Claims, 3 Drawing Sheets

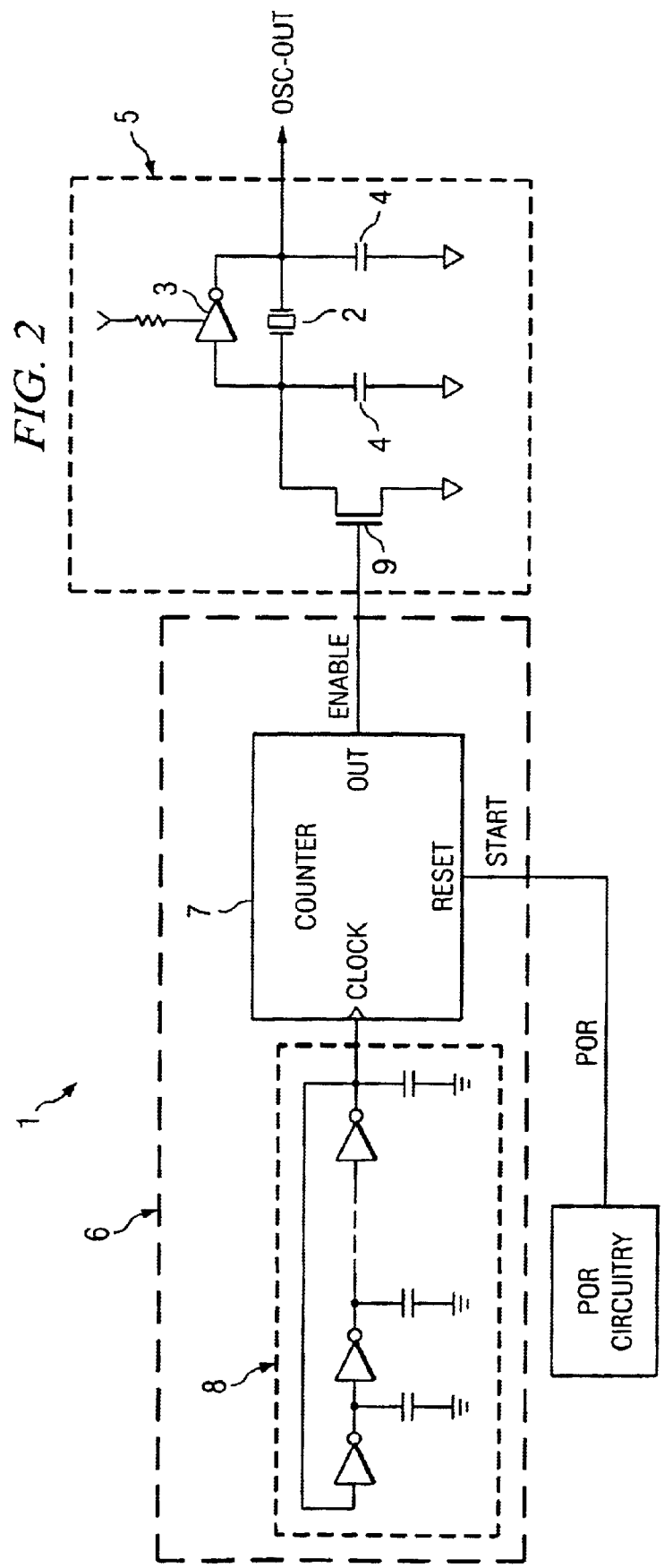

US 6,903,616 B2

STARTUP CIRCUIT AND METHOD FOR STARTING AN OSCILLATOR AFTER POWER-OFF

BACKGROUND OF THE INVENTION

1. Technical Field of the Invention

The present invention relates to starting an oscillator, and particularly to a circuit and method for starting an oscillator shortly after power-up.

2. Description of the Related Art

Crystal oscillators have been used in the electronics industry for decades for providing a clock or other signal having a fixed, predetermined frequency. Some existing crystal oscillator circuits receive an enable signal to enable the crystal oscillator circuit to oscillate at the desired frequency at a time during system operation selected and controlled by the system in which the oscillator circuit is located. A shortcoming, however, with this type of system-controlled operation is that some systems may not be capable of controlling the time at which an oscillator circuit is to be enabled to oscillate. What is needed, then, is an oscillator circuit that quickly and easily commences oscillating substantially without additional system control or other overhead.

SUMMARY OF THE INVENTION

Embodiments of the present invention overcome the above-described shortcomings in existing crystal oscillator circuits and satisfy a significant need for a crystal oscillator circuit that will quickly and easily commence oscillating. In an exemplary embodiment of the present invention, the oscillator circuit is initially disabled from oscillating and enabled a period of time following the oscillator circuit being initially powered up, such as a predetermined period of time following the completion of a power-up sequence and/or a power-on-reset signal transitioning from a reset state to a non-reset state. The oscillator circuit may include a counter to define the predetermined period of time. By delaying the commencement of the oscillations by the oscillator circuit until after power applied thereto has stabilized, the oscillator circuit is better ensured to oscillate relatively soon after the oscillator circuit is powered up.

BRIEF DESCRIPTION OF THE DRAWINGS

A more complete understanding of the system and method of the present invention may be obtained by reference to the following Detailed Description when taken in conjunction with the accompanying Drawings wherein:

FIG. 2 is a schematic drawing showing an implementation of a portion of the oscillator circuitry of FIG. 1 according to an exemplary embodiment of the present invention;

DETAILED DESCRIPTION OF THE EXEMPLARY EMBODIMENTS

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 1:
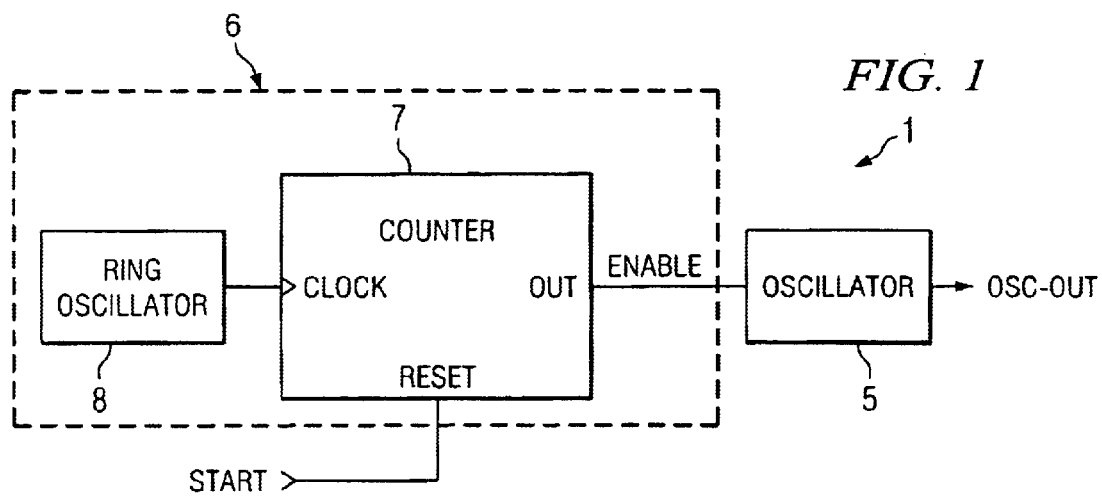
FIG. 1 is a block diagram of oscillator circuitry according to an exemplary embodiment of the present invention.

Referring to FIG. 1, there is shown oscillator circuitry 1 according to an exemplary embodiment of the present invention. In general terms, oscillator circuitry 1 generates an output signal OSC-OUT that oscillates between at least two logic levels approximately at a predetermined frequency, starting a predetermined period of time following completion of a system power-up sequence.

Oscillator circuitry 1 may include a crystal oscillator circuit 5 for generating output signal OSC-OUT. Oscillator circuit 5 may include crystal 2, a logic inverter 3 coupled between the terminals of crystal 2, and a pair of capacitors 4 (see FIG. 2). Each capacitor 4 may include a first plate terminal coupled to a distinct terminal of crystal 2 and a second terminal coupled to a reference voltage, such as ground. The operation of crystal 2, logic inverter 3 and capacitors 4 as shown in FIG. 1 is known in the art and will not be described further for reasons of simplicity.

It is understood that crystal oscillator circuit 5 may have other implementations to cause output signal OSC-OUT to oscillate. It is further understood that the oscillator circuit 5 may be implemented without a crystal and nevertheless generate an output signal OSC-OUT that oscillates between at least two voltage levels and/or between at least two states.

Oscillator circuitry 1 may further include an enable circuit 6 for enabling the above-described crystal oscillator circuit 5 to oscillate. Enable circuit 6 may generate a signal, ENABLE, that is provided to the crystal oscillator circuit 5 to enable the crystal oscillator circuit 5 to oscillate. When in an active state, signal ENABLE enables the crystal oscillator circuit 5 to oscillate and thereby cause output signal OSC-OUT to oscillate between at least two logic levels. When in an inactive state, signal ENABLE disables the crystal oscillator circuit from oscillating, thereby causing output signal OSC-OUT to be fixed at one of the logic levels. In the exemplary embodiment of oscillator circuitry 1 shown in FIG. 1, the active state for signal ENABLE is a logic low (logic zero), and the inactive state is a logic high (logic one). However, it is understood that the active state of signal ENABLE may be a logic high (logic one) and the inactive state of signal ENABLE may be a logic low.

Enable circuit 6 may include a start input for receiving a start-up signal START. Enable circuit 6 is adapted to delay the enabling of the crystal oscillator circuit 5 to oscillate for a predetermined period of time following the start-up signal START transitioning from an inactive state to an active state. In order to provide for the delay of a predetermined period of time, enable circuit 6 may include a counter 7 having an output signal that generates the signal ENABLE and a control input coupled to signal START, and a ring oscillator 8 which generates a clock signal that is applied to the clock input of counter 7. The signal START, when placed in the inactive state, places counter 7 in a predetermined state. In the exemplary embodiment shown in FIG. 1, the control input of counter 7 is a reset input for selectively resetting counter 7. It is understood, though, that the control input of counter 7 may be used to place counter 7 in other states, such as a set state in which each latch/flip-flop element forming counter 7 is placed in a logic high state, or a state in which the latch/flip-flop elements of counter 7 are not all placed in the same state.

When powered and operational, ring oscillator 8 generates an oscillating signal at a predetermined frequency. Ring oscillator 8 may include an odd number of logic inverters connected together to form a loop. Following counter 7 starting in the reset state, application of the oscillating signal to counter 7 results in the output thereof toggling from one logic state to another after a predetermined number of cycles of the oscillating signal has elapsed. In this way, enable circuit 6 enables crystal oscillator circuit 5 after a predetermined period of time following counter 7 being activated by signal START.

It is understood that each of counter 7 and ring oscillator 8 may have any of a number of different circuit implementations, as is known in the art.

Oscillator circuitry 1 is adapted to be used in an electronics system requiring an oscillating signal. In the exemplary embodiment of the present invention, crystal oscillator circuit 5 is enabled to oscillate shortly after completion of a system power-up sequence. In this regard, oscillator circuitry 1 is adapted to receive at its START input a power-on-reset signal POR. Power-on-reset signal POR may be generated to provide a transition from a reset logic state (which resets or initializes circuitry in the system) to a non-reset state upon completion of the system power-up sequence and/or following the system being powered. In this way, counter 7 of enable circuit 6 will be in a fixed state, such as the reset state, initially upon the system being powered up, and, subsequent to the power-up sequence, will begin counting.

FIG. 2 shows a circuit implementation of oscillator circuitry 1 according to an exemplary embodiment of the present invention. In particular, the circuit implementation of FIG. 2 shows how crystal oscillator circuit 5 is enabled by signal ENABLE. Crystal oscillator circuit 5 may include a transistor 9. Transistor 9 may be coupled across one of the capacitors 4. In this way, signal ENABLE turns on transistor 9 and thereby disables crystal oscillator circuit 5 from oscillating when signal ENABLE is in the inactive (logic high) state. Signal ENABLE turns off transistor 9 and thereby enables crystal oscillator circuit 5 to oscillate when signal ENABLE is in the active (logic low) state.

Figure 3:
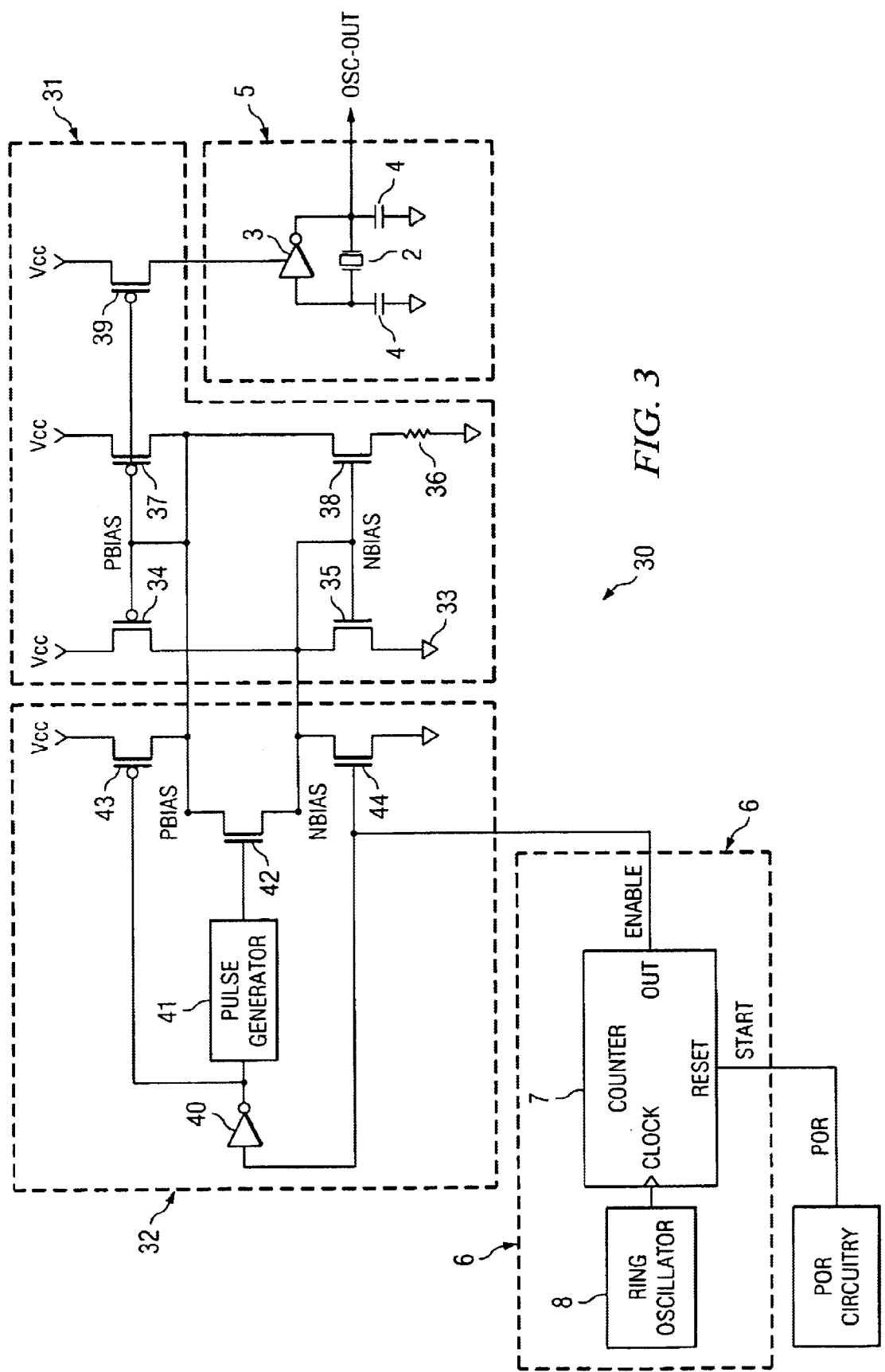
FIG. 3 is a schematic drawing showing another implementation of a portion of the oscillator circuitry of FIG. 1 according to an exemplary embodiment of the present invention.

FIG. 3 illustrates oscillator circuitry 30 according to another exemplary embodiment of the present invention. In this embodiment, crystal oscillator circuit 5 is provided current from a current source 31. Current source 31 may be enabled to provide current to crystal oscillator circuit 5 by signal ENABLE using enable control circuitry 32.

Current source 31 may be implemented as a current mirror having a first current leg 33 including a p-channel transistor 34 and an n-channel transistor 35 coupled thereto, a second current leg 36 having a p-channel transistor 37 and an n-channel 38, and a third current leg having a p-channel transistor 39 that provides current to oscillator circuit 5 when activated. The control terminals of p-channel transistors 34, 37 and 39 are connected together, and the control terminals of n-channel transistors 35 and 38 are connected together. It is understood that the transistors in second current leg 36 and the third current leg may be sized proportionally to the transistors in first current leg 33 so as to provide the desired current levels in the second and third current legs, respectively. Nodes PBIAS and NBIAS in current source 31 may refer to the nodes at the control terminals of the p-channel transistors and the n-channel transistors of current source 31, respectively.

It is understood that current source 31 may be implemented in other ways so that signal ENABLE controls whether or not current is provided to crystal oscillator circuit 5 and thus whether or not crystal oscillator circuit 5 oscillates.

Enable control circuitry 32 is adapted to receive the signal ENABLE and control current source 31 to selectively provide current to oscillator circuitry 5. Enable control circuitry 32 may include a logic inverter 40 which receives signal ENABLE and generates a logically inverted version thereof. A pulse generator circuit 41 may receive the output of logic inverter 40 and generate a pulse at an output upon the output of logic inverter 40 transitioning between logic states. For instance, pulse generator 41 may generate at its output a positive going pulse when the input of pulse generator 41 transitions from a logic high state to a logic low state. The output of pulse generator 41 may be coupled to a control transistor 42, which may have a first conduction terminal coupled to node PBIAS in current source 31 and a second conduction terminal coupled to node NBIAS therein. When activated, control transistor 42 may serve to short nodes PBIAS and NBIAS together.

A second control transistor 43 in enable control circuitry 32 may be coupled between the high reference voltage Vcc and node PBIAS and have a control terminal coupled to the output of logic inverter 40. A third control transistor 44 may be coupled between the low reference voltage Vss and node NBIAS and have a control terminal coupled to signal ENABLE. Second control transistor 43 serves to couple node PBIAS to the high reference voltage Vcc when activated, and third control transistor 44 serves to couple node NBIAS to the low reference voltage Vss when activated. By activating second control transistor 43 and third control transistor 44, the transistors in current source 31 are deactivated, thereby deactivating current source 31 and preventing current from being sourced to oscillator circuitry 5.

Figure 4:
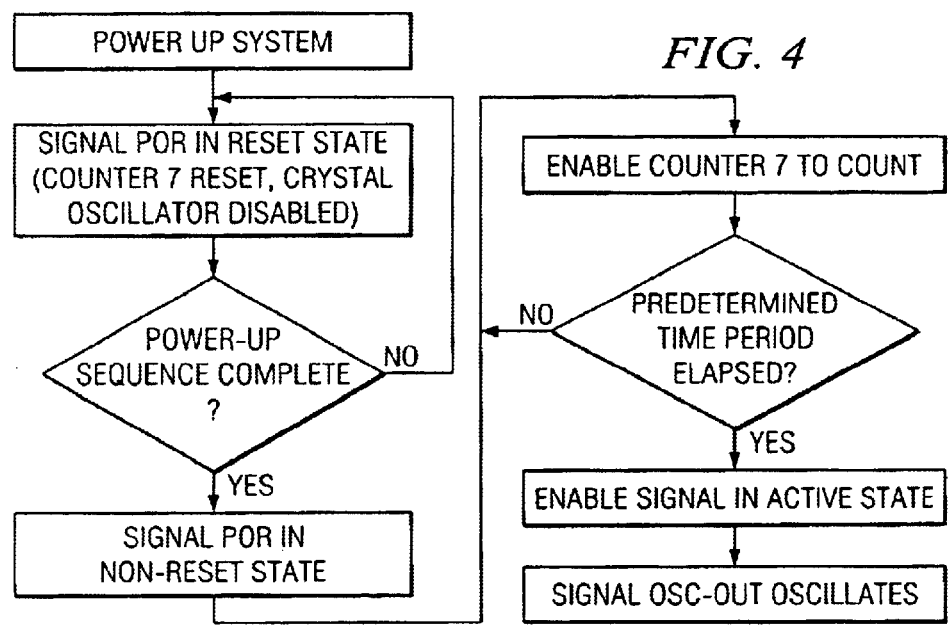
FIG. 4 is a flow chart illustrating an operation of the oscillator circuit of FIG. 1 according to an exemplary embodiment of the present invention.

The operation of the oscillator circuitry of the present invention will be described with reference to FIG. 4. Initially, a power-up sequence begins and/or power is provided to the system in which the oscillator circuitry is located. The supply voltage may, for example, ramp upwardly from the ground voltage. During this time, power-on-reset signal POR is placed in the reset state, which in the exemplary embodiments is a logic low value. Signal POR being in the reset state causes counter 7 to be reset and to remain in the reset state regardless of the signal appearing at the clock input of counter 7.

Counter 7 being in the reset state causes signal ENABLE to be in an inactive state (logic high, in this case). With respect to the oscillator circuitry of FIG. 2, signal ENABLE being in the logic high state activates transistor 9 and prevents crystal oscillator circuit 5 from oscillating. With respect to the oscillator circuitry of FIG. 3, signal ENABLE being in the logic high state activates second control transistor 43 and third control transistor 44, which thereby causes nodes PBIAS and NBIAS to be in logic high and logic low states, respectively, so that current source 31 fails to conduct current. Without current sourced by current source 31, oscillator circuitry 5 is prevented from oscillating.

At or around the end of the power-up sequence, system circuitry and/or power-on-reset circuitry causes signal POR to transition to the non-reset logic state. This results in counter 7 no longer being held in the reset state and thereby being enabled to count clock signals appearing at its clock input. Around the time of the power-up sequence, ring oscillator 8 commences oscillating, which causes its output signal to oscillate. Being enabled, counter 7 counts a predetermined number of clock cycles appearing on its clock input (i.e., the output of ring oscillator 8). When the predetermined number of clock cycles appearing on the clock input of counter 7 has elapsed, signal ENABLE is driven by counter 7 from the inactive state to the active state (logic low state). With regard to the oscillator circuitry of FIG. 2, signal ENABLE being in the active state turns off transistor 9 and enables crystal oscillator circuit 5 to oscillate. With regard to the oscillator circuitry of FIG. 3, signal ENABLE being in the active (logic low) state turns off control transistors 43 and 44 and causes pulse generator 41 to generate a positive-going pulse at its output. This pulse temporarily activates control transistor 42 so as to short together nodes PBIAS and NBIAS at a voltage level that is sufficient to turn on the transistors in current source 31. After completion of the pulse, the control transistors 42–44 in enable control circuitry 32 are deactivated so that current is able to flow in each current leg of current source 31, which thereby results in current being provided to oscillator circuitry 5 for oscillation.

By delaying the time when crystal oscillator circuit 5 oscillates until system power has stabilized, crystal oscillator circuit 5 is better ensured to begin oscillating properly and quickly.

Figure 5:
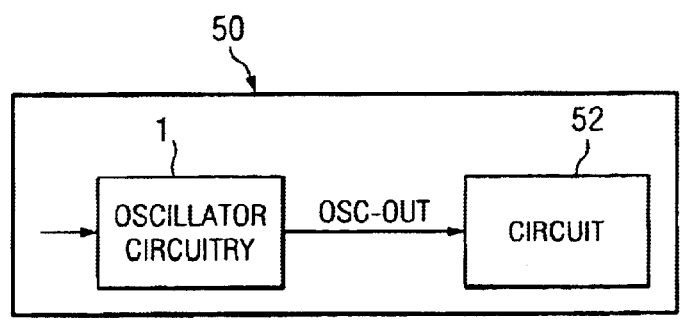
FIG. 5 is a diagram of a system containing the oscillator circuitry of FIG. 1.

FIG. 5 illustrates a system 50 in which the oscillator circuitry of the present invention may be disposed. System 50 may include the oscillator circuitry according to the embodiments of the present invention, and circuitry 52 that receives the output signal OSC-OUT for use as a clock signal, some other type of synchronization signal, etc. System 50 may be any type of system, such as a telecommunications system, an automotive-related system and a computer system.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A circuit, comprising:
  a first oscillator circuit adapted to oscillate at a predetermined frequency in response to an enable signal;
  a second oscillator circuit generating an internal signal; and
  an enable circuit having an output generating the enable signal, the enable signal having an inactive state upon the circuit being powered up and an active state to enable the first oscillator circuit to oscillate following a predetermined number of oscillations of the internal signal generated by the second oscillator circuit.

2. The circuit of claim 1, wherein the enable circuit comprises a counter operable to count the oscillations of the internal signal generated by the second oscillator circuit.

3. The circuit of claim 2, wherein the second oscillator circuit comprises a ring oscillator having an output coupled to a clock input of the counter.

4. The circuit of claim 2, wherein the counter includes a control input which, when in an active state, places the counter in a predetermined state, the control input being coupled to power-on-reset circuitry.

5. The circuit of claim 4, wherein the control input is a reset input that selectively resets the counter.

6. The circuit of claim 1, wherein the first oscillator circuit comprises:
  a crystal;
  at least one capacitor coupled to the crystal; and
  a transistor coupled across the capacitor and having a control terminal coupled to the output of the enable circuit.

7. The circuit of claim 1, further comprising:
  a current source that selectively sources current to the first oscillator circuit, including at least one enable input; and
  a control circuit having an input coupled to the output of the enable circuit and at least one output coupled to the at least one enable input of the current source.

8. A circuit, comprising:
  an oscillator circuit adapted to oscillate at a predetermined frequency; and
  an enable circuit having an input and an output coupled to the oscillator circuit, the output of the enable circuit having an inactive state upon the circuit being powered up and an active state to enable the oscillator circuit to oscillate a predetermined period of time following the input of the enable circuit transitioning from the inactive state;
  wherein the enable circuit comprises a ring oscillator.

9. A method for enabling an oscillator circuit to oscillate, comprising:
  counting a certain number of clock cycles following initial power powering up of the oscillator circuit;
  generating an enable signal, in response to the counting of the certain number of clock cycles, that transitions from an inactive state to an active state so as to enable the oscillator circuit to oscillate; and
  applying the enable signal to the oscillator circuit.

10. A method for enabling an oscillator circuit to oscillate, comprising:
  receiving a power-on-reset signal;
  generating an enable signal that transitions from an inactive state to an active state so as to enable the oscillator circuit to oscillate, the enable signal transitions to the active state a period of time following the power-on-reset signal transitioning from a reset state; and
  applying the enable signal to the oscillator circuit;
  wherein the step of generating an enable signal comprises counting a number of periods of a clock signal and driving the enable signal to the active state when a predetermined number of clock periods appear on the clock signal.

11. The method of claim 10, wherein the predetermined number of clock periods are counted from a time when the power-on-reset signal transitions from the reset state.

12. The method of claim 10, wherein the step of generating an enable signal further comprises generating the clock signal.

13. A method for enabling an oscillator circuit to oscillate, comprising:
  receiving a power-on-reset signal;
  generating an enable signal that transitions from an inactive state to an active state so as to enable the oscillator circuit to oscillate, the enable signal transitions to the active state a period of time following the power-on-reset signal transitioning from a reset state; and
  applying the enable signal to the oscillator circuit;
  wherein the oscillator circuit comprises a crystal, and the step of applying comprises shorting a terminal of the crystal to a predetermined voltage when the enable signal is in the inactive state end releasing the shorting of the terminal when the enable signal is in the active state.

14. A circuit, comprising:

an oscillator circuit capable of oscillating at a predetermined frequency; and an enable circuit having an output coupled to the oscillator circuit, the output of the enable circuit transitioning from an inactive state to an active state so as to enable oscillation of the oscillator circuit, the transitioning of the output happening a predetermined number of counted clock cycles following the circuit being initially powered.

15. The circuit of claim 14, wherein the enable circuit comprises a counter for counting the predetermined number of clock cycles.

16. The circuit of claim 15, wherein the enable circuit further comprises a ring oscillator generating the clock cycles.

17. The circuit of claim 15, wherein the counter includes a control input which selectively places the counter in a predetermined state.

18. The circuit of claim 17, wherein the control input is a reset input that selectively resets the counter.

19. The circuit of claim 17, wherein the control input receives a power-on-reset signal.

20. The circuit of claim 14, wherein the oscillator circuit comprises:

a crystal;

at least one capacitor coupled to the crystal; and a transistor coupled across the capacitor and having a control terminal coupled to the output of the enable circuit.

21. The circuit of claim 14, further comprising a power-on-reset circuit, wherein the enable circuit comprises a counter having an output coupled to the output of the enable circuit and a control input used to selectively place the counter in a known state, the control input being coupled to the output of the power-on-reset circuit.

22. The circuit of claim 14, further comprising:

a current source that selectively sources current to the oscillator circuit and includes at least one enable input; and a control circuit having an input coupled to the output of the enable circuit and at least one output coupled to the at least one enable input of the current source.

23. The circuit of claim 22, wherein the control circuit comprises a pulse generator having an input coupled to the output of the enable circuit, and a transistor coupled between nodes in the current source and having a control terminal coupled to an output of the pulse generator, the transistor being temporarily activated by the pulse generator.

24. A circuit, comprising:

an oscillator circuit capable of oscillating at a predetermined frequency; and an enable circuit having an output coupled to the crystal oscillator circuit, the output of the enable circuit transitioning from an inactive state to an active state a predetermined period of time following the circuit being initially powered, for enabling the oscillating the oscillator circuit to oscillate;

wherein the enable circuit comprises a ring oscillator.

25. A system, comprising:

a circuit having an oscillating signal input; and oscillator circuitry for receiving an enable signal and generating the oscillating signal following a predetermined number of counted clock cycles following the received enable signal transitioning its state.

26. A system, comprising:

a circuit; and oscillator circuitry for receiving an enable signal and generating an oscillating signal at an output of the oscillator circuitry, the output of the oscillator circuitry being coupled to the circuit, the oscillating signal oscillating a predetermined period of time following the received enable signal transitioning to a first logic state;

wherein the oscillator circuitry comprises:

a counter having a control input utilized to place the counter in a predetermined state, a clock input and an output, the control input being coupled to the enable signal; and a crystal having a terminal coupled to the output of the counter.

27. The system of claim 26, wherein the oscillator circuitry further comprises a ring oscillator having an output coupled to the clock input of the counter.

28. The system of claim 26, wherein the oscillator circuitry further comprises a transistor having a conduction terminal coupled to the terminal of the crystal and a control terminal coupled to the output of the counter.

29. The system of claim 26, wherein the oscillator circuitry further comprises a logic inverter coupled to the crystal, and a current source for selectively providing current to the logic inverter, the current source having an enable input coupled to an output of the counter.

* * * * *